United States Patent [19]

Brasfield

[11] 4,243,934
[45] Jan. 6, 1981

[54] COMPOSITE SIGNAL GENERATOR

[75] Inventor: Robert G. Brasfield, Seattle, Wash.

[73] Assignee: The Boeing Company, Seattle, Wash.

[21] Appl. No.: 8,312

[22] Filed: Feb. 1, 1979

[51] Int. Cl.³ ............................................. G01R 31/02
[52] U.S. Cl. ...................................... 324/72; 324/52;
307/261
[58] Field of Search ................... 324/72, 424, 111, 52;
307/261; 328/156, 187

[56] References Cited
U.S. PATENT DOCUMENTS 3,569,829  3/1971  Griffey .................................. 324/52
3,571,752  3/1971  Strum, Jr. .............................. 324/52

Primary Examiner—David K. Moore
Attorney, Agent, or Firm—James P. Hamley; Bernard A. Donahue

[57] ABSTRACT

The signal generator produces an output comprised of a periodic signal and a precision amplitude pulse. A periodic waveform source is fed to the center tap of a transformer. The instantaneous amplitude of the waveform is sensed and, when it reaches a predetermined level, one free end of the transformer is grounded thereby producing a predetermined amplitude pulse, superimposed on the periodic waveform, at the remaining free end.

6 Claims, 4 Drawing Figures

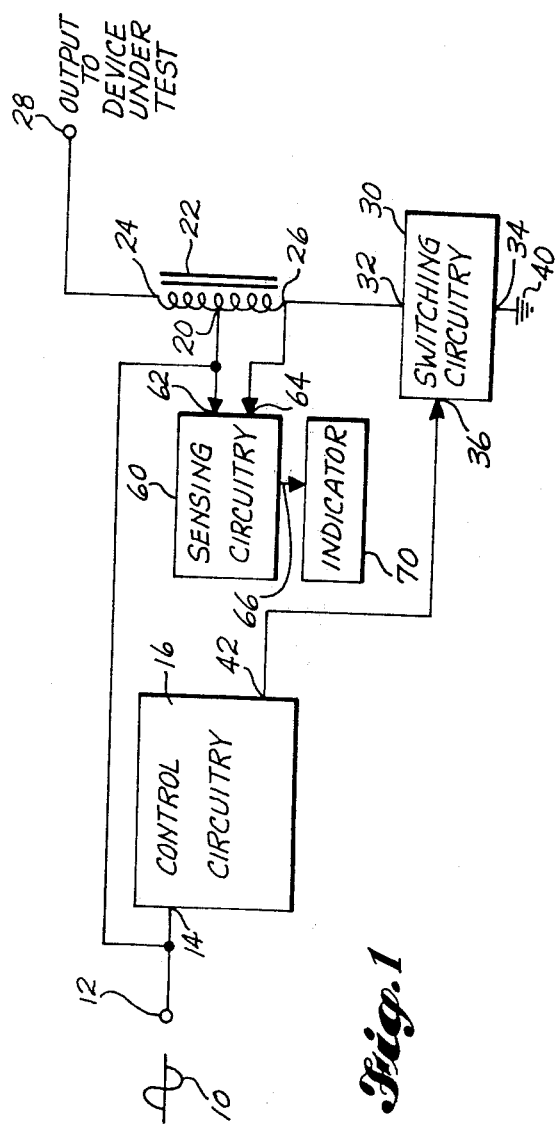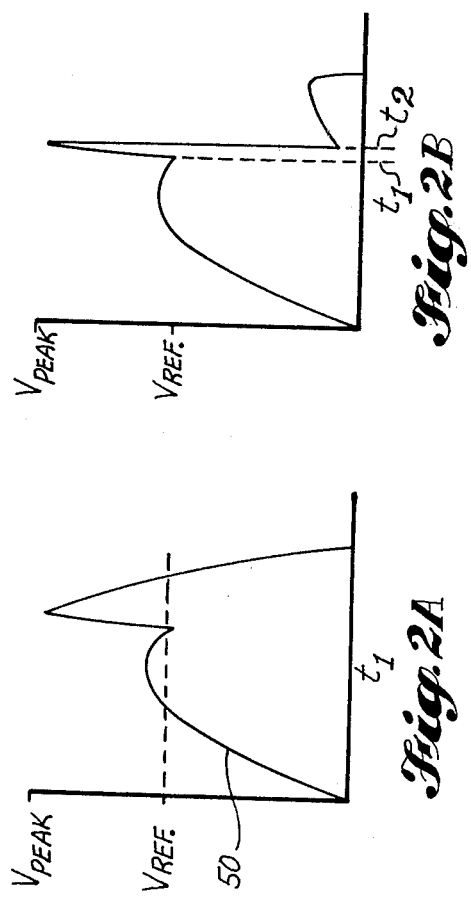

COMPOSITE SIGNAL GENERATOR

BACKGROUND OF THE INVENTION

The present invention pertains to the electrical signal generation art and, more particularly, to a means for generating a composite electrical signal.

Whereas composite signal generators, i.e. generators capable of combining two waveforms into one, have been used extensively in the electronics art, there are numerous applications for which existing composite signal generators are inadequate. An example of this inadequacy is the electrical component test art, more particularly, test equipment for checking the lightning protectors of commercial aircraft. Here, a set of lightning protectors are connected between ground and each of three output bus lines from an outboard main generator. The lightning protectors function to prevent equipment damage due to induced transients caused by lightning. Normally, the high induced voltages are grounded through the protectors. However, sustained or excessively high transient voltages may damage the protectors. It is important to proper operation of the aircraft, therefore, that these protectors be checked periodically to insure that they operate at the desired value.

Prior to the instant invention, a very cumbersome and time consuming technique was used for checking such protectors. Its procedure included the operator disconnecting the protector from the bus, connecting it to a a variable alternating current source and monitoring with an AC voltmeter and an oscilloscope. The operator slowly increases the AC voltage on the protector until the oscilloscope waveform indicates that it has activated. The voltage at which this occurred is then compared against a specification.

There has been a long felt need in this art, therefore, for a composite signal generator which can quickly and efficiently test lightning protectors without the need for elaborate test equipment.

SUMMARY OF THE INVENTION

It is an object of this invention, therefore, to provide an improved composite signal generator.

It is a particular object of the invention to provide the above composite signal generator which is suitable for testing the lightning protectors found on commercial airplanes.

Briefly, according to the invention, a composite signal generating means includes a means for providing a periodic waveform. A provided transformer has first and second end taps and a central tap, all of the taps being in a predetermined electromagnetic circuit configuration. Suitable means couples the periodic waveform to the transformer central tap. A control means senses the periodic waveform and, in response to a predetermined condition thereof, couples the second end point to a reference potential whereby the signal appearing at the first end point is the periodic waveform with a predetermined transient signal superimposed thereon.

Preferably, the control means includes a comparator which compares the level of the periodic waveform with a predetermined level and, in response to the periodic waveform having a predetermined relationship with respect to the reference, produces an output signal which causes switching of the transformer second end tap to the reference potential. Because of the fixed transforming action of the transformer, the output voltage at the first end tap precisely attains a predetermined maximum.

The instant composite generator has been found to be particularly suited for the automatic testing of airplane lightning protectors. In this application, the first end tap of the transformer is coupled to the lightning protectors. A periodic sine wave signal is normally coupled to the center tap of the transformer. Upon the amplitude of the periodic waveform reaching the predetermined voltage, the second end tap of the transformer is switched to a reference potential thereby producing a pulse at the first end tap, which pulse is suitable for testing the operation of the lightning protectors. An activated lightning protector may be sensed by sensing circuitry coupled to the central and second end taps of the transformer. If a lightning protector activates under test, the current between these taps reverses, which reversal is sensed and caused to activate indicating circuitry.

BRIEF DESCRIPTION OF THE DRAWINGS

FIG. 1 is a block diagram illustrating general construction of the inventive composite signal generator;

FIGS. 2A and 2B are representative waveforms illustrating operation of the circuit shown in FIG. 1.

DETAILED DESCRIPTION OF THE PREFERRED EMBODIMENT OF THE INVENTION

Figure 3:
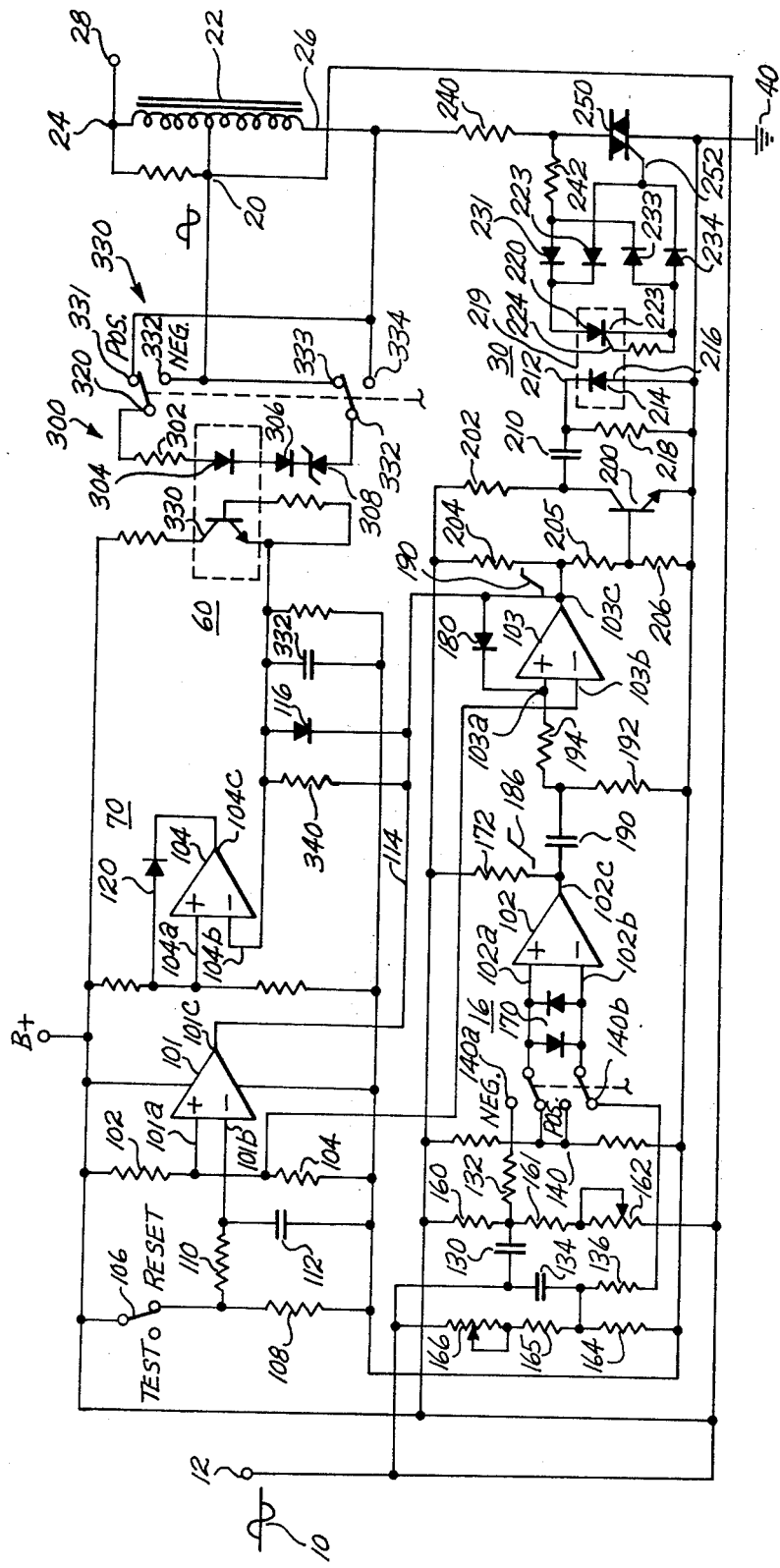
FIG. 3 is a detailed schematic diagram illustrating the preferred embodiment of the composite signal generator for use in testing lightning protectors found on commercial airplanes.

FIG. 1 is a block diagram illustrating the basic topology of the preferred embodiment of the composite signal generator. Here, a periodic waveform, indicated as a sine wave 10 is coupled to the input 12 of the generator. The periodic waveform 10 may be supplied from any appropriate source, such as the alternating current power mains. The AC waveform is connected both to the input 14 of control circuitry 16 and to the center tap 20 of a transformer 22. Transformer 22 also includes first and second end taps 24, 26, respectively. A predetermined electromagnetic circuit is established among the taps 20, 24 and 26 due to the inter-coupling therebetween, as is well known in the art.

The first end tap 24 of transformer 22 comprises the output of the composite signal generator. For purposes of example, this point would be connected to the lightning protector to be tested.

The second end tap 26 of transformer 22 connects to switching circuitry 30. Switching circuitry 30 is comprised of first and second terminals 32, 34 and a control terminal 36. In response to a signal at its control input 36, switching circuitry 30 causes a low impedance path to be created between its first and second terminals 32,34, respectively. Otherwise, a relatively high impedance exists between terminals 32, 34.

Terminal 34 is connected to reference, or ground potential 40 whereas the control terminal 36 is connected to an output 42 from the control circuitry 16.

The basic operation of the composite signal generator may be understood as follows with reference to FIG. 2A which is a representative waveform found at the output 28 of the composite generator. Initially the switching circuitry 30 is in its high impedance mode whereby the second end tap 26 of transformer 22 is "floating". Thus, the input periodic waveform 10 is directly connected through center tap 20 and a portion of transformer 22 to the output 28. This is shown in FIG. 2A as portion 50 of the graph. Provided within control circuitry 16, as is more clearly understood with reference to FIG. 3, is comparator circuitry which constantly monitors the amplitude of the waveform 10 and compares it with a fixed internal reference voltage $V_{ref}$, indicated as a horizontal dashed line on FIG. 2A. Once the input waveform signal falls from a high level to a level just below the reference $V_{ref}$ the control circuitry produces an output signal at its output 42 which activates switching circuitry 30 to its low impedance state. At this time, indicated as $t_1$ in FIG. 2A, the second end tap 26 is coupled to ground potential 40. Now, transformer 22 acts in the normal manner to transform the voltage at its center tap 20 by a factor determined by the turns ratio of transformer 22 whereby a high voltage signal, $V_{peak}$ as indicated on FIG. 2A, appears at the first end tap 24.

It should be understood that the level of the pulse $V_{peak}$ is precisely controlled since the transformer step-up ratio is a fixed value and the voltage impressed between the center tap 20 and the second end tap 26 is a predetermined value at the time the transformer step-up occurs. Thus, despite variations in the peak to peak value of the input periodic waveform, the transient peak voltage will always be regulated at a desired level. For the example wherein the output 28 of the composite generator is used to test operation of lightning protectors the peak to peak value of the AC signal simulates that normally occurring on the airplane bus whereas the value of the peak transient is selected to simulate transients occurring from, for example, a lightning strike.

If the electrical device at the output 28 of the composite generator is activated under test, this can be quickly and easily detected via sensing circuitry 60 and indicator 70. Sensing circuitry 60 has a pair of inputs 62, 64 which are connected to the center tap 20 and second end tap 26 of the transformer 22, respectively. During the occurrence of a transient at the output 28, second end tap 26 is coupled substantially to ground potential. However, should the electrical device under test be activated, a transient is passed through transformer 22 momentarily raising the voltage at second end tap 26 above that at center tap 20. Thus, a current reversal is created between terminals 20, 26, which reversal is sensed by sensing circuitry 60 which, in turn, produces a signal at its output 66 activating indicator 70.

FIG. 2B is a representative waveform of the signal at the composite generator 28 for the condition wherein an electrical device under test, such as a lightning protector, is activated upon application of the peak voltage $V_{peak}$. As a result of a low impedance conducting state of the device under test, the voltage at the output 28 drops near ground potential at time $t_2$. As mentioned hereinabove, through the action of transformer 22 when the first end tap 24 is taken near ground potential the second end tap 26 is raised to a potential exceeding that at center tap 20. This polarity reversal is sensed by sensing circuit 60 which causes an indication at indicator 70.

FIG. 3 is a detailed schematic diagram illustrating the preferred construction of the composite signal generator shown in FIG. 1. Identical numerals have been used to indicate the same portions of the generator as shown in FIG. 1.

The principal logic functions of the composite signal generator are performed by four standard comparators 101-104. Each comparator includes a noninverting input 101a-104a, inverting input 101b-104b and an output 101c-104c, respectively. While any one of a number of commercially available comparators 101-104 might be utilized, in this, the preferred embodiment of the invention, a National Semiconductor type LM 139A quad comparator was employed.

Comparator 101, and its associated circuitry perform a switch bounce elimination function. Here, a fixed reference voltage is applied to the noninverting input 101a via a voltage divider comprised of resistors 102, 104. Applied to the inverting input 101b of comparator 101 is a voltage which is a function of the state of TEST/RESET switch 106 as coupled through resistors 108, 110 and shunt capacitor 112. With switch 106 in its reset position, as shown, the full bias voltage B+ is applied to the inverting input 101b of comparator 101 thereby driving its output at 101c low. This, in turn, holds the output 103c of comparator 103 low via the connection at line 114. In so doing, control circuitry 16 is maintained in an off condition.

In addition, with the output 101c low, current through diode 116 pulls the inverting input 104b of indicator comparator 104 low, thereby maintaining its output 104c at a high level thus preventing current through light emitting diode indicator 120.

Upon activation of switch 106 to the test state, the voltage at the inverting input 101b of comparator 101 falls below the fixed voltage at its noninverting input 101a at a rate determined by the value of resistors 108, 110 and capacitor 112. In this, the preferred embodiment of the invention, the values of these components are selected such that the voltage at the inverting input 101b falls below that at the noninverting input 101a approximately 0.11 seconds following activation of switch 106. This time delay prevents circuit malfunctions due to bounce of switch 106 and enables the control circuitry 16 and the indicator circuitry 70 following the defined delay period.

Comparators 102 and 103 perform the control circuitry function 16. An input periodic waveform 10 is applied to a voltage divider comprised of capacitor 130, resistors 160 and 161, and potentiometer 162. An attenuated sample of the input periodic waveform is coupled from the voltage divider through resistor 132, to first terminal 140a of a double pole double throw switch 140. In a similar manner the periodic waveform is attenuated by a voltage divider comprised of capacitor 134, resistors 164 and 165, and potentiometer 166, with the attenuated sample coupled through resistor 136 to the fourth terminal 140d of switch 140. A fixed DC voltage determined by resistors 150 and 152 is applied to second and third terminals 140b, c of switch 140.

A pair 170 of reversely oriented diodes protects the inputs 102a, b of comparator 102 from an excessive differential voltage input, as is common in this art. An output load resistor 172 couples to bias potential B+ at the output 102c of comparator 102.

In operation, the periodic waveform signal is fed either to the noninverting input 102a or inverting input 102b of comparator 102 dependent upon the position of switch 140. Switch 140 allows a precision pulse to be generated at output terminal 28 either during the positive or negative transition of the periodic waveform. Switch 140 is shown in its positive position, the fixed DC voltage being applied to the noninverting input 102a.

During the initial portion of the periodic waveform 10, the voltage at the noninverting input 102a exceeds that at the inverting input 102b whereby the output 102c of comparator 102 is activated to a high state. When the instantaneous voltage at the inverting input 102b exceeds the fixed voltage at the noninverting input 102a the output 102c of comparator 102 is activated to a low state. Upon the periodic waveform falling below the fixed reference at the noninverting input 102a, comparator 102 has its output 102c activated back to the high state. Thus, during one complete cycle of the periodic waveform the output 102c of comparator 102 is activated from a high to low state and then back to a high state. As will be more clearly understood hereafter, the pulse output coincides with a low to high change at the output 102c of comparator 102. Since this change occurs at a predetermined instantaneous voltage of the input periodic waveform the absolute magnitude of the pulse produced at the systems output is precisely regulated.

The desired value of the peak output voltage is determined by potentiometer 166 with the circuit in its positive pulse mode, and by potentiometer 162 in the negative pulse mode. Capacitor 134 adds a small voltage proportional to voltage rate of change to the periodic sample voltage from the junction of resistor 165 and resistor 164. This compensates for the rise time of the test pulse output which, due to lags in the circuit and the transformer 22, occurs a fixed time interval after the trigger voltage produced at the output 102c of comparator 102. Capacitor 130 compensates in a similar manner when switch 140 is in the negative position.

Comparator 103, and its associated circuitry, act as a bistable multivibrator. As discussed with respect to bounce eliminator comparator 101, the output 103c of comparator 103 is forced low by comparator 101 when TEST/RESET switch is at reset. With its output low and no feedback provided through diode 180 the output 103c of comparator 103 is driven low due to a finite DC voltage being applied to its input 103b as determined by resistors 102, 104. After the aforementioned finite time delay following switch 106 being activated to the test position, the bistable 103 is free to respond to signals at its inputs.

Thus, a subsequent low to high transition, as is indicated by waveform 186, at the output 102c of comparator 102 is coupled, via capacitor 190 and resistors 192, 194 to the noninverting input 103a of bistable comparator 103. This transition causes the output 103c of bistable 103 to assume a high state. Now, due to feedback applied through diode 180, comparator 103 is maintained in the high state, being unresponsive to any subsequent signals at the output of comparator 102.

A low to high transition, such as waveform 190 at the output of comparator 103, activates switching circuitry, indicated generally at 30. The input of switching circuitry 30 is an NPN transistor 200 having its emitter connected to ground potential 40 and its collector connected through a load resistor 202 to the source of bias B+. The output 103c of comparator 103 is coupled to the base of transistor 200 via resistors 204-206.

Upon the appearance of a trigger pulse 190 at the output of comparator 103 the base of transistor 200 is driven high thus inducing increased collector current and driving the collector of transistor 200 low. This high to low transition, as coupled through capacitor 210, creates a negative voltage at the cathode 212 of light emitting diode 214 whose anode 216 connects to ground potential 40. Current flow is thus established through light emitting diode 214 for a period of time determined by the value of capacitor 210 and of discharge resistor 218.

Light emitting diode 214 is part of an assembly 219 which also includes a silicon controlled rectifier 220. Light generated by light emitting diode 214 causes triggering of the gate 221 of silicon controlled rectifier 220 creating a low impedance between its anode and cathode terminals 222, 223, respectively. In this, the preferred embodiment of the invention, unit 219 is comprised of a General Electric photon coupled isolator, type 4N40.

Current through silicon controlled rectifier SCR 220 is provided by bridge rectifier action through rectifier diodes 231-234 which full wave rectify the AC signal normally appearing at the second end tap 26 of transformer 22. Thus, the AC signal applied to the center tap 20 of transformer 22 is inductively coupled through to the second end tap 26 and through resistors 240 and 242 to the bridge rectifier diodes 231-234. The use of the bridge rectifier diodes 231-234 allows silicon controlled rectifier 220 to be fired during either positive or negative values of the periodic waveform.

The firing of SCR 220 causes a corresponding firing of a triac 250 via its trigger input 252. Triac 250 is a commonly available component which has the characteristic of being actuable to a low impedance with either a positive or negative polarity across its terminals. Thus, triac 250 is triggerable to a low impedance condition during either positive or negative levels of the periodic waveform.

In the manner described herein above with respect to FIG. 1, activation of the triac 250 pulls the second end tap 26 of transformer 22 near ground potential thereby creating a precision amplitude pulse at the output 28 of the transformer. Prior to firing of triac 250, the high impedance state of triac 250 allows the second end tap 26 of transformer 20 to "float" whereby the signal appearing at the output 28 of transformer 22 is substantially the periodic signal applied at the center tap 20.

The actuation of an electrical component, such as a lightning protector, at the transformer output 28 is sensed by sensing circuitry, indicated generally at 60. The sensing circuitry 60 includes a current sensing loop 300 comprised of a series resistor 302, light emitting diode 304, semiconductor rectifier 306 and Zener diode 308. The loop 300 connects between movable connectors 320, 322 of a double pole, double throw switch 330. Switch 330 has fixed contacts 331-334. The first and fourth contacts, 331, 334 are connected in common to the second end tap 26 of transformer 22. Similarly, the second and third fixed contacts 332, 333 are connected in common to the center tap 20 of transformer 22.

Switch 330, which is preferably mechanically ganged with switch 140, orients the current loop 300 with respect to the center tap 20 and second end tap 26 of transformer 22 such that a current through the loop is produced only upon a polarity reversal of transformer 22 due to a momentary near ground potential at the output 28, caused by actuation of the device under test. Light emitting diode 304 and semiconductor rectifier 306 assure that current through the loop will occur only if the proper polarity is applied. In addition, Zener diode 308 assures that loop current will exist only if the loop voltage exceeds the breakdown voltage of this diode.

For the condition wherein current is passed through current loop 300, light emitting diode 304 generates optical energy which is coupled to the base of optically sensitive transistor 330. In the preferred embodiment of the invention, light emitting diode 304 and optical responding transistor 330 are an integral unit, available under General Electric part number 4N26. When transistor 330 conducts, the charge across capacitor 332 is increased thus increasing the voltage at inverting input 104b of comparator 104. If this voltage increases to a value exceeding that at the noninverting input 104a, the output 104c of comparator 104 is driven low whereby current conducts through light emitting diode 120 thereby indicating actuation of the device under test. With diode 120 conducting the reference voltage at the noninverting input 104a is reduced and current through a resistor 340 sustains the charge across capacitor 332 such that current is maintained through light emitting diode 120 until switch 106 is returned to the reset position.

In summary, a signal generator capable of producing a precision amplitude pulse in composite with a periodic waveform has been described.

While a preferred embodiment of the invention has been described in detail, it should be apparent that many modifications and variations thereto are possible, all of which fall in the true scope and spirit of the invention.

I claim:

1. A composite signal generator comprising:
   means for providing a periodic waveform;
   transformer means having first and second end taps and a central tap, said taps being in a predetermined electromagnetic circuit configuration;
   means for coupling the periodic waveform to said transformer central tap; and
   control means for sensing the periodic waveform and, in response to a predetermined condition thereof, coupling the transformer second end tap to a reference potentional such that the signal appearing at the transformer first end tap is the periodic waveform with a predetermined transient signal superimposed thereon.

2. The composite signal generator of claim 1 wherein said control means includes
   comparator means for comparing the instantaneous level of the periodic waveform with a predetermined reference level and, in response to the periodic waveform having a predetermined relationship with respect to the reference, producing an output trigger signal; and
   switching means coupled between said transformer second end tap and said reference potential, said switching means responding to a trigger signal produced by said comparator means to couple said second end tap through a relatively low impedance to said reference potential, said switching means otherwise producing a relatively high impedance between said second end tap and said reference potential.

3. The composite signal generator of claim 1 for use in the testing of electrical components wherein a component to be tested is connected between said transformer first tap and said reference potential, said component signal generator in combination with:
   sensing circuitry, coupled to the central and second end taps of said transformer, for sensing a current reversal therebetween caused by the actuation of an electrical component under test during the occurrence of said transient signal; and
   indicating means responsive to said sensing circuitry for producing an indication of said actuated component.

4. The composite signal generator of claim 2 for use in the testing of electrical components wherein a component to be tested is connected between said transformer first tap and said reference potential, said component signal generator in combination with:
   sensing circuitry, coupled to the central and second end taps of said transformer, for sensing a current reversal therebetween caused by the actuation of an electrical component under test during the occurrence of said transient signal; and
   indicating means responsive to said sensing circuitry for producing an indication of said actuated component.

5. The combination of claim 3 wherein the electrical components to be tested comprise lightning protectors coupled between generator bus lines and reference potential and wherein the amplitude of said periodic waveform is selected to be that value commonly found on the bus line and the amplitude of said transient signal is selected to simulate the effect of a lightning strike to the generator bus line.

6. The combination of claim 4 wherein the electrical components to be tested comprise lightning protectors coupled between generator bus lines and reference potential and wherein the amplitude of said periodic waveform is selected to be that value commonly found on the bus line and the amplitude of said transient signal is selected to simulate the effect of a lightning strike to the generator bus line.

* * * * *